United States Patent [19]

Fukuhara et al.

[11] Patent Number: 4,605,860
[45] Date of Patent: Aug. 12, 1986

[54] APPARATUS FOR FOCUSING A CHARGED PARTICLE BEAM ONTO A SPECIMEN

[75] Inventors: Satoru Fukuhara, Kokubunji; Mikio Ichihashi, Kodaira; Hisaya Murakoshi; Shigemitsu Seitoh, both of Hachioji, all of Japan

[73] Assignee: Hitachi, Ltd., Tokyo, Japan

[21] Appl. No.: 654,457

[22] Filed: Sep. 26, 1984

[30] Foreign Application Priority Data

Sep. 28, 1983 [JP] Japan ................. 58-177954

[51] Int. Cl.⁴ .................... G01K 1/08; H01J 3/14
[52] U.S. Cl. .............................................. 250/397
[58] Field of Search .............. 250/310, 311, 396 R, 250/397; 219/121 ES

[56] References Cited

U.S. PATENT DOCUMENTS 3,919,550 11/1975 Banbury ........................ 250/397
3,937,959 2/1976 Namae .......................... 250/311
4,514,634 4/1985 Lawson ......................... 250/397

FOREIGN PATENT DOCUMENTS 52-7670 1/1977 Japan ........................ 250/397

Primary Examiner—Bruce C. Anderson
Attorney, Agent, or Firm—Antonelli, Terry & Wands

[57] ABSTRACT

Disclosed is an apparatus for focusing a charged particle beam onto a specimen, which comprises a scanner for scanning a pre-formed standard pattern with a charged particle beam, a converging unit capable of converging the charged particle beam onto a specimen, a detector for detecting secondary charged particles emitted as a result of scanning the standard pattern by the scanner, a circuit for deriving a standard frequency component determined by the period of scanning with the charged particle beam and the shape of the portion of the standard pattern in the region being scanned with the charged particle beam, and a circuit cooperating with the converging unit for finding the maximum value of the amplitude of the standard frequency component thereby identifying attainment of focusing of the charged particle beam with high accuracy.

6 Claims, 7 Drawing Figures

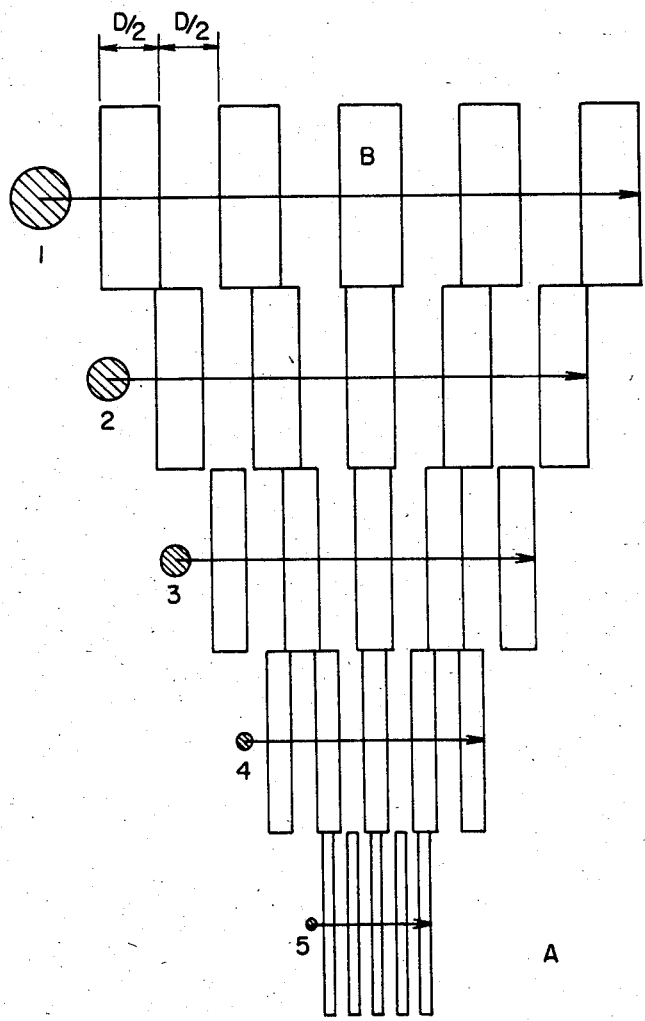

APPARATUS FOR FOCUSING A CHARGED PARTICLE BEAM ONTO A SPECIMEN

BACKGROUND OF THE INVENTION

This invention relates to a focusing method and apparatus suitable for use in a scanning electron microscope or a charged particle beam apparatus using a charged particle beam for dimension measurement of LSI's, IC's, etc.

The technical task of automatic focusing in a scanning electron microscope or the like has been how attainment of focusing can be detected with high accuracy.

A method commonly employed hitherto for detecting the state of focusing utilizes the fact that the frequency of a picture image signal from a scanning electron microscope or the like becomes progressively high with the decrease in the spot diameter of the charged particle beam. According to the prior art method, weight coefficients proportional to frequencies are used for multiplication, and the results of multiplication are summed for comparison of output signals. The method described above is generally called a differentiated value comparison method since a differentiator is incorporated in the detection circuit. (Refer to Japanese Patent Application Laid-open No. 5642945 (1981), columns 3 to 5.) However, the prior art method has been defective in that various noises in pulse form appear due to the use of a photomultiplier tube and an operational amplifier in the detection system of the scanning electron microscope, and, especially, in the case of a specimen having a bad S/N ratio (especially, a semiconductor specimen such as an IC or an LSI), the detection circuit tends to mal-operate by being adversely affected by such noises, resulting in impossibility of attainment of automatic focusing with high accuracy.

SUMMARY OF THE INVENTION

With a view to obviate the prior art defect pointed out above, it is a primary object of the present invention to provide a focusing apparatus which can detect attainment of focusing of a charged particle beam onto a specimen with high accuracy.

In accordance with the present invention which attains the above object, there is provided an apparatus for focusing a charged particle beam onto a specimen, comprising scanning means for scanning a pre-formed standard pattern with a charged particle beam, converging means capable of converging the charged particle beam onto a specimen, detecting means for detecting secondary charged particles emitted as a result of scanning the standard pattern by the scanning means, means for deriving a standard frequency component determined by the period of scanning with the charged particle beam and the shape of the portion of the standard pattern in the region being scanned with the charged particle beam, and means cooperating with the converging means for finding the maximum value of the amplitude of the standard frequency component thereby identifying attainment of focusing of the charged particle beam.

BRIEF DESCRIPTION OF THE DRAWINGS

FIG. 1 illustrates one form of a standard pattern formed on the surface of a specimen.

DESCRIPTION OF THE PREFERRED EMBODIMENTS

Preferred embodiments of the present invention will now be described in detail with reference to the drawings.

Any desired pattern can be easily formed on the surface of a semiconductor specimen such as an IC or an LSI. A standard pattern I composed of lines and spaces as, for example, shown in FIG. 1 is formed on the surface of such a specimen. In FIG. 1, symbols A and B designate different materials having respective secondary emission efficiencies $\sigma_A$ and $\sigma_B$ and are arranged to alternate with an equal width in each row. The relation between the secondary emission efficiencies $\sigma_A$ and $\sigma_B$ is, for example, $\sigma_A < \sigma_B$.

Figure 2A:
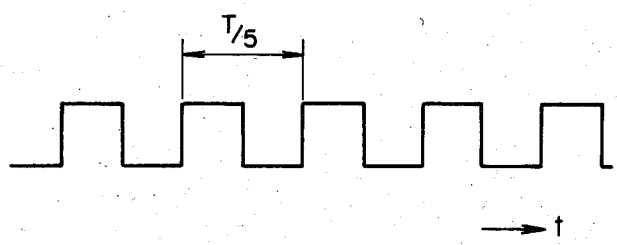
FIG. 2A shows the waveform of a detected signal.
Figure 2B:
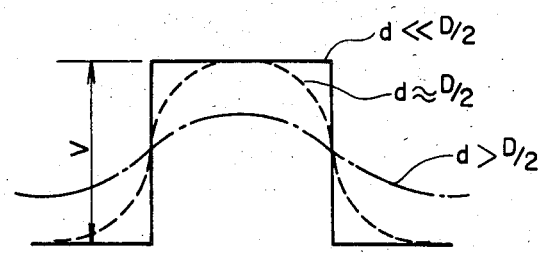
FIG. 2B shows how the signal waveform varies depending on the relation between the spot diameter d of the charged particle beam and the width D/2 of the pattern portions on the specimen.

When now a charged particle beam is converged into the state of a spot, and linear scanning with such a charged particle beam is made in a direction as shown by the arrows in FIG. 1, a secondary charged particle emission detection signal having a rectangular waveform as shown in FIG. 2A is obtained. When the linear scanning is repeatedly executed, the signal shown in FIG. 2A is periodically observed. The recurrence frequency fo of the rectangular waveform in the signal is determined by both the period T (sec) of linear scanning with the charged particle beam and the number of lines and spaces in the region of the standard pattern I being scanned with the charged particle beam and is 5/T (Hz) in the case of FIG. 1. With the increase in the spot diameter d of the linear-scanning charged particle beam, the shape of the rectangular waveform varies in a manner as shown in FIG. 2B. Suppose that the width of the material B on the linear scanning line is D/2. Then, a waveform as shown by the solid lines in FIG. 2B appears under the condition in which the spot diameter d is given by d<<D/2, a waveform as shown by the dotted lines appears under the condition of $d \approx D/2$, and a waveform as shown by the one-dot chain lines appears under the condition of d>D/2. It will be seen in FIG. 2B that, with the gradual increase in the spot diameter d relative to the width D/2 of the line, the shape of the detected signal waveform varies correspondingly and the amplitude V of the signal waveform decreases also correspondingly. Under the condition of d>>D/2, the amplitude V decreases to zero resulting in a waveform having no contrast.

Figure 3A:
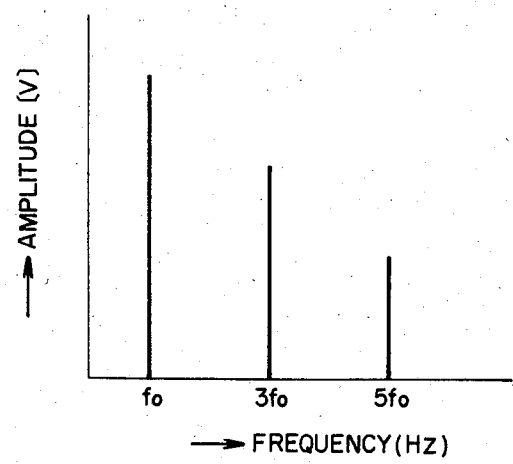
FIG. 3A is a graph showing the results of analysis of the signal waveform shown in FIG. 2A.

When frequency analysis is made on the series of the waveforms above described according to the Fourier transformation, the waveforms can be classified into a standard frequency fo and its higher harmonics as shown in FIG. 3A. Since the standard frequency fo is determined by both the period T of linear scanning and the number of lines and spaces in the scanned region of the pattern I, it remains unchanged regardless of the increase in the spot diameter d. However, it has been experimentally found that the signal level (amplitude) Vs of the signal having the standard frequency fo becomes maximum at the point F where the beam spot diameter d becomes minimum and focusing is attained.

Therefore, the spot diameter d of the charged particle beam is optimized when the exciting current supplied to an objective lens is so controlled that the signal having the standard frequency fo is detected and the amplitude Vs of the detected signal having the standard frequency fo becomes maximum. In the present invention, the detected signal waveform is dependent upon the relation between the spot diameter d of the charged particle beam and the width D/2 of the lines and spaces. Therefore, the optimum value of the spot diameter d of the charged particle beam is determined by the value of the width D/2 of the lines and spaces in the pattern I. It can be seen in FIG. 1 that the spot diameter d of the charged particle beam can be decreased by shifting the region of linear scanning toward the pattern portions having the smaller values of D/2. The region of linear scanning is decreased in proportion to the scale-down rate of the lines and spaces of the pattern I and is shifted in the order from the pattern portion No. 1 to the pattern portion No. 5 in FIG. 1, thereby making it possible to detect attainment of focusing with high accuracy.

Figure 4:
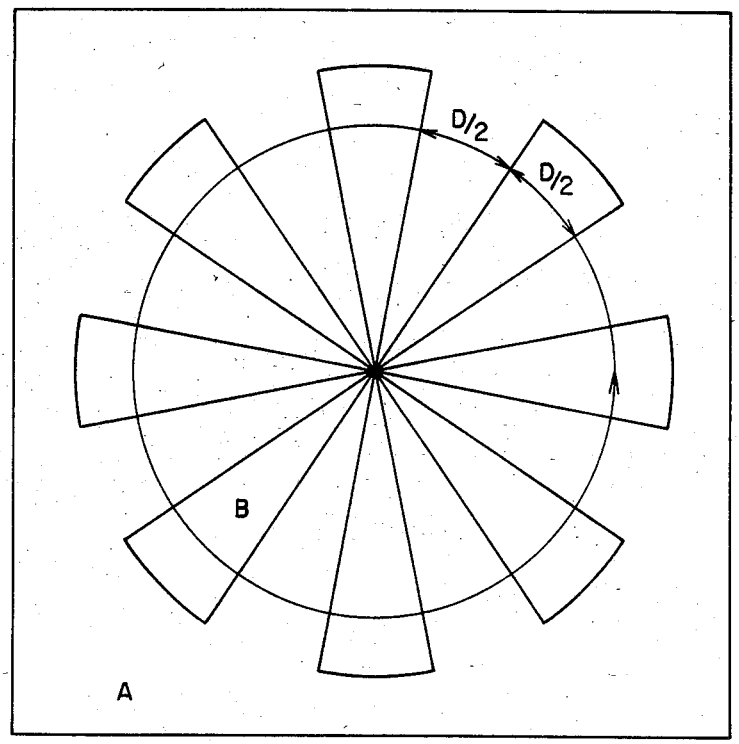
FIG. 4 illustrates another form of the standard pattern formed on the surface of a specimen.

The line-space pattern I shown in FIG. 1 is especially effective when no astigmatic aberration occurs in the charged particle beam. However, when astigmatic aberration occurs in the charged particle beam, a radial pattern (a second standard pattern II) as shown in FIG. 4 is preferably formed. In FIG. 4, the charged particle beam makes circular scanning around the center of the radial pattern as shown by the arrow. A detected signal waveform similar to the square waveform shown in FIG. 2A is obtained, and, in the case of FIG. 4, the recurrence frequency fo is 8/T (Hz). As described already, the region of circular scanning is similarly shifted toward the central portion of the radial pattern where the pattern shape is smallest, so as to provide a highly accurate, minimum spot diameter d of the charged particle beam.

The line-space pattern and the radial pattern described above are each composed of two kinds of different materials A and B having respective secondary emission efficiencies $\sigma_A$ and $\sigma_B$. However, the present invention is also applicable to the case where the materials A and B are the same. In such a case, the part B in FIG. 1 is made, for example, convex relative to the part A, so that the secondary charged particles emitted from the convex portions can reach the detector more easily than those emitted from the concave portions, and a square waveform similar to that shown in FIG. 2A can be obtained. The present invention is also similarly applicable to the case where the standard pattern I or II is provided on a specimen stage mounting a specimen thereon.

Figure 5:
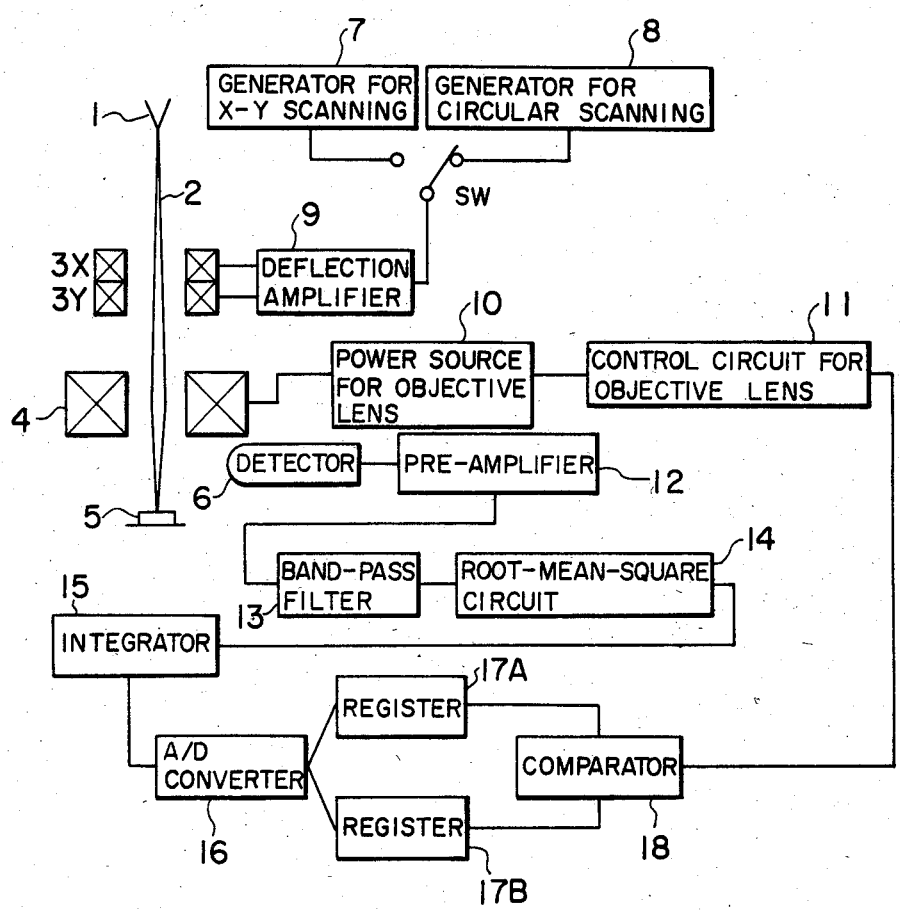
FIG. 5 is a block diagram showing the structure of an embodiment of the focusing apparatus according to the present invention.

FIG. 5 shows the practical structure of one form of an apparatus which is constructed to put the above method into practice when the present invention is applied to a scanning electron microscope.

Referring to FIG. 5, a charged particle beam 2 emitted from a cathode 1 is converged by an objective lens 4 to be directed toward and onto a specimen 5. A radial pattern as shown in FIG. 4 is previously provided on the surface of the specimen 5. A signal from a generator 8 for circular scanning is applied to deflection coils 3X and 3Y through a switch $S_W$ and a deflection amplifier 9 to make circular scanning on the radial standard pattern formed on the surface of the specimen 5. Secondary charged particles emitted from the specimen 5 are arrested by a detector 6, and the output signal of the detector 6 is applied through a pre-amplifier 12 to a band-pass filter 13 having its gain on the component of the standard frequency fo only. The output signal of the band-pass filter 13 is applied to a root-mean-square circuit 14 which detects the effective value of the signal, and the output signal of the root-mean-square circuit 14 is applied to an integrator circuit 15 which integrates the input for a predetermined period of time. The integrator output signal is converted into a digital data by an A/D converter circuit 16, and the digital data is registered in a first register 17A. Subsequently, the exciting current I supplied to the objective lens 4 is increased by $\Delta I$, and secondary charged particles emitted from the specimen 5 are similarly detected by the detector 6, the digital data thus obtained being registered in a second register 17B.

Figure 3B:
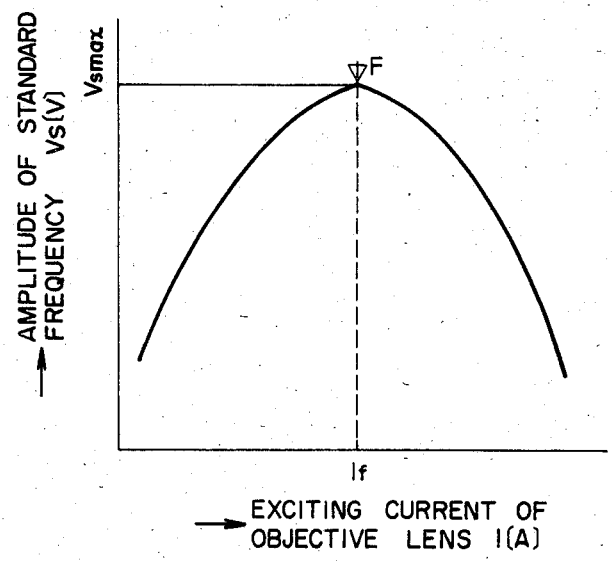
FIG. 3B is a graph showing the relation between the amplitude of the standard frequency fo shown in FIG. 3A and the spot diameter d of the charged particle beam.

Then, the digital data registered in the registers 17A and 17B are compared in a comparator circuit 18. When the result of comparison proves that 17A<17B, an up signal commanding an increase in the exciting current supplied to the objective lens 4 is applied from the comparator circuit 18 to a control circuit 11 for objective lens, and the control signal from the control circuit 11 is applied to a power source 10 for objective lens to further increase the exciting current by $\Delta I$. Such an operation is sequentially repeated, and the contents of the register registering a digital value smaller than that of the other are replaced by a new digital data for the purpose of comparison therebetween. As shown in FIG. 3B, the relation between the exciting current I supplied to the objective lens 4 and the output signal of the detector 6 is such that the amplitude $V_s$ of the detector output signal attains its maximum when the exciting current I has a value $I_f$ at which the spot diameter d of the charged particle beam becomes minimum. It will be seen from FIG. 3B, therefore, that, when the lens exciting current I is increased sequentially by $\Delta I$ and the resultant digital data registered in the registers 17A and 17B are alternately updated, the exciting current I supplied to the objective lens 4 increases finally up to the level $I_f$ at which the desired focusing of the charged particle beam is attained.

Suppose now that the objective-lens exciting current I attains the level $I_f$ at time $t_0$, and the A/D converter output signal at that time is applied to the register 17A. The relation between the contents of the registers 17A and 17B at that time is 17A>17B, since the signal converted at time $(t_0-1)$ is registered already in the register 17B. Subsequently, the objective-lens exciting current I is increased by $\Delta I$ at time $(t_0+1)$, and the resultant A/D converter output signal is applied now to the register 17B. The result is 17A >17B. Therefore, a down signal is now applied from the comparator circuit 18 to the objective-lens control circuit 11 for decreasing the objective-lens exciting current I by $\Delta I$. Consequently, the exciting current I attains the level $I_f$ at the next time $(t_0+2)$, and the relation 17A=17B holds between the contents of the registers 17A and 17B. Thereafter, neither the up signal nor the down signal appears from the comparator circuit 18, and the level of the objective-lens exciting current I is fixed at $I_f$, so that the maximum value of the amplitude of the detector output signal can be found.

Thereafter, the region of circular scanning is sequentially shifted toward the center of the radial pattern, and similar operation is repeatedly executed. In this manner, the maximum value of the amplitude of the standard frequency component fo is found so that the minimum value of the spot diameter d of the charged particle beam can be automatically detected.

The above description has referred principally to the mode of circular scanning effected when astigmatic aberration is present in the charged particle beam. However, when there is no astigmatic aberration in the charged particle beam, a scanning signal from a generator 7 for X-Y scanning shown in FIG. 5 is used for linear scanning on the aforementioned line-space standard pattern so as to detect attainment of focusing with high accuracy.

Further, the above description has referred to the method in which, for example, the level of the exciting current supplied to the objective lens 4 is varied stepwise. However, it is apparent that another method or a so-called functional approximation method can be employed which comprises varying the objective-lens exciting current to a plurality of levels only, detecting the corresponding signal levels to find the relation between the objective-lens exciting current and the detected signal level for each of the current values, and making approximation on a polynomial of n-th degree to find the optimum focusing. Further, although the standard frequency only is detected for the purpose of comparison in the aforementioned embodiment of the present invention, it is needless to mention that automatic focusing with higher accuracy can be achieved by simultaneously detecting and summing the standard frequency and its higher harmonics shown in FIG. 3A.

It will be appreciated from the foregoing detailed description of the present invention that the state of focusing of a charged particle beam can be detected with high accuracy of, for example, about 1/10 of the width of lines of the standard pattern shown in FIGS. 1 and 4.

We claim:

1. An apparatus for focusing a charged particle beam onto a specimen, comprising scanning means for scanning a pre-formed standard pattern with a charged particle beam, converging means having a current controlled lens means for converging said charged particle beam onto a specimen, detecting means for detecting secondary charged particles emitted as a result of scanning said standard pattern by said scanning means, means for deriving a standard frequency component of the detected signal from said detecting means determined by the period of scanning with said charged particle beam and the shape of the portion of said standard pattern in the region being scanned with said charged particle beam, and means for controlling the current for said lens means of said converging means to find the maximum value of the amplitude of said standard frequency component thereby identifying attainment of focusing of said charged particle beam.

2. A focusing apparatus as claimed in claim 1, wherein a narrow-band-pass filter is used as said means for deriving said standard frequency component.

3. A focusing apparatus as claimed in claim 1, wherein said standard pattern is in the form of the combination of lines and spaces, and said scanning means makes linear scanning on such a standard pattern.

4. A focusing apparatus as claimed in claim 1, wherein said standard pattern is in the form of the combination of radial lines and spaces, and said scanning means makes circular scanning on such a standard pattern.

5. A focusing apparatus as claimed in claim 1, wherein said standard pattern is formed on the surface of said specimen.

6. A focusing apparatus as claimed in claim 1, wherein said standard pattern is formed on a specimen stage mounting said specimen thereon.

* * * * *